(12) United States Patent
Chao

(10) Patent No.: US 8,605,434 B2
(45) Date of Patent: Dec. 10, 2013

(54) WALL-MOUNTING STRUCTURE FOR WALL-MOUNTED ELECTRONIC DEVICE

(75) Inventor: Yung-Jui Chao, Taoyuan Hsien (TW)

(73) Assignee: Adlink Technology Inc., New Taipei (TW)

( * ) Notice: Subject to any disclaimer, the term of this patent is extended or adjusted under 35 U.S.C. 154(b) by 66 days.

(21) Appl. No.: 13/461,011

(22) Filed: May 1, 2012

(65) Prior Publication Data

US 2013/0294039 A1 Nov. 7, 2013

(51) Int. Cl.
*H05K 7/20* (2006.01)
(52) U.S. Cl.
USPC ............ 361/690; 361/715; 361/730; 361/752
(58) Field of Classification Search
None
See application file for complete search history.

(56) References Cited

U.S. PATENT DOCUMENTS

| | | | | |
|---|---|---|---|---|
| 5,796,585 A | * | 8/1998 | Sugiyama et al. | 361/735 |
| 5,913,351 A | * | 6/1999 | Miura | 16/340 |
| 5,931,550 A | * | 8/1999 | Chen | 312/244 |
| 5,975,659 A | * | 11/1999 | Yang et al. | 312/223.2 |
| 6,250,727 B1 | * | 6/2001 | Kan et al. | 312/223.2 |
| 6,382,744 B1 | * | 5/2002 | Xiao | 312/223.2 |
| 7,042,710 B1 | * | 5/2006 | Beseth et al. | 361/679.01 |
| 7,858,886 B2 | * | 12/2010 | Helms et al. | 174/535 |
| 8,375,575 B2 | * | 2/2013 | Snider et al. | 29/830 |
| 8,493,739 B2 | * | 7/2013 | Snider et al. | 361/704 |
| 2011/0110026 A1 | * | 5/2011 | Goza | 361/679.6 |
| 2012/0218725 A1 | * | 8/2012 | Snider et al. | 361/753 |

* cited by examiner

*Primary Examiner* — Gregory Thompson
(74) *Attorney, Agent, or Firm* — Muncy, Geissler, Olds & Lowe, PLLC

(57) ABSTRACT

A wall mounting structure for wall-mounted electronic device includes a device shell having a coupling structure disposed in an accommodation open chamber therein at two opposite lateral sides, a circuit board mounted in the accommodation open chamber, a cover plate having sliding coupling rods respectively extended from two side flanges thereof and detachably coupled to the coupling structure of the device shell and a bottom flange attached to the bottom side of the device shell to support the device shell, and two mounting brackets affixed to the cover plate at two opposite lateral sides for fastening to a wall of an external object.

10 Claims, 10 Drawing Sheets

WALL-MOUNTING STRUCTURE FOR WALL-MOUNTED ELECTRONIC DEVICE

BACKGROUND OF THE INVENTION

1. Field of the Invention

The present invention relates wall-mounted electronic device mounting technology and more particularly, to a wall mounting structure for wall-mounted electronic device, which facilitates mounting and dismounting without any tools, saving much installation labor and time and allows quick cleaning and troubleshooting.

2. Description of the Related Art

In the computer and information era, many different electronic products have been created to serve people. Following progress of innovation activities in technology, multipurpose has become the mainstream of computer-controlled electronic products. In modern electronic products, computer plays the main role.

As an advanced microprocessor for computer has great power, the use of an advanced microprocessor in a computer allows expansion of hardware devices, such as hard disk drives, CD-ROMs and programmers. A server for industrial computer generally comprises a main board, a power supply unit, cooling fans and other electronic components. However, due to limited internal space, the arrangement of electronic components in a server must be well designed, leaving the necessary space for plugging/unplugging of bus lines.

Further, in order to save floor or table space, wall-mounted computers and electronic devices are created. A wall-mounted computer, e-kanban, intelligent information inquiry system or electronic device has a low-profile characteristic for mounting on a wall to match with the configuration of a display screen or TV, saving much installation space.

FIG. 10 illustrates is a schematic sectional view of a conventional wall-mounted computer. As illustrated, the mainframe A of the wall-mounted computer includes two mounting plates B bilaterally disposed at the back side. Each mounting plate B has multiple mounting through holes B1. Screws B2 are respectively mounted in the mounting through holes B1 of the mounting plates B and driven into a support wall to affix the wall-mounted computer to the support wall. When performing a maintenance or repair work, the technician must loosen the screws B2 for allowing removal of the mainframe A from the support wall. This dismounting procedure is complicated, wasting much labor and time. When a detailed repair is required, the supplier may directly replace the failed mainframe A with a new one, and send the failed mainframe A back to the office for repair. Before repairing the failed mainframe A, the technician must detach the side panel of the mainframe A.

SUMMARY OF THE INVENTION

The present invention has been accomplished under the circumstances in view. It is the main object of the present invention to provide a wall mounting structure for wall-mounted electronic device, which facilitates mounting and dismounting without any tools, saving much installation labor and time and allows quick cleaning and troubleshooting.

To achieve this and other objects of the present invention, a wall mounting structure for wall-mounted electronic device comprises a device shell, which comprises a coupling structure disposed in an accommodation open chamber therein at two opposite lateral sides, a circuit board mounted in the accommodation open chamber of the device shell, a cover plate, which comprises a plurality of sliding coupling rods respectively extended from two opposite side flanges thereof and terminating in a respective hook tip and detachably coupled to the coupling structure of the device shell and a bottom flange attached to the bottom side of the device shell to support the device shell, and two mounting brackets affixed to the cover plate at two opposite lateral sides for fastening to a wall of an external object. By means of inserting respective sliding coupling rods of the back cover into respective elongated sliding slots of the coupling structure and then moving the device shell downwardly relative to the back cover to attach a bottom panel of the device shell to the bottom flange, the device shell and the cover plate are locked together.

Further, fastening members may be arranged at the bottom flange of the cover plate for fastening to respective mounting screw holes at the bottom side of the device shell to lock the device shell to the cover plate. When going to detach the device shell from the cover plate for a maintenance or cleaning work, loosen the fastening members, and then lift the device shell relative to the cover plate to disengage the hook tips of the sliding coupling rods from the coupling structure for allowing removal of the sliding coupling rods from the elongated sliding slots of the coupling structure, and then move the device shell forwardly away from the cover plate. After removal of the device shell from the cover plate, the circuit board is exposed to the outside, allowing dismounting directly for replacement or troubleshooting.

DETAILED DESCRIPTION OF THE PREFERRED EMBODIMENT

Figure 1:
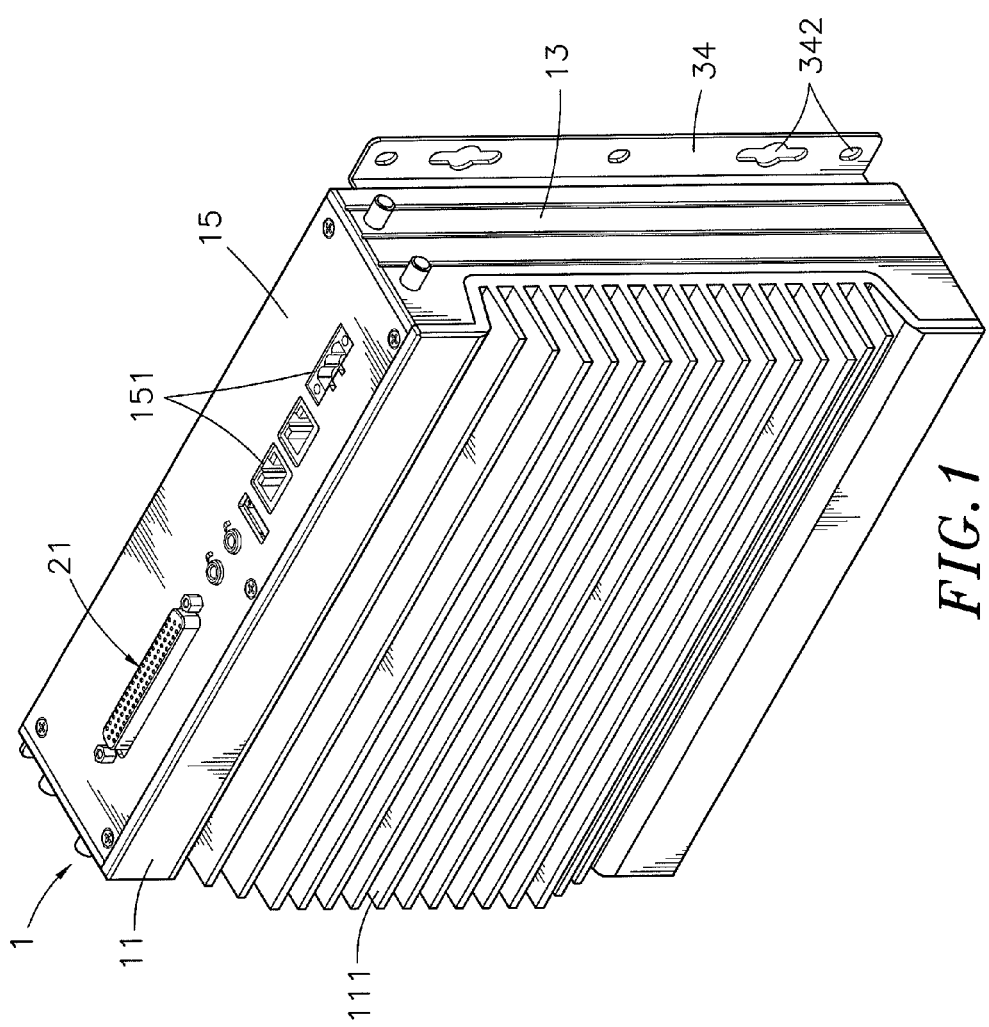
FIG. 1 is an oblique top elevational view of a wall mounting structure for wall-mounted electronic device in accordance with the present invention.
Figure 2:
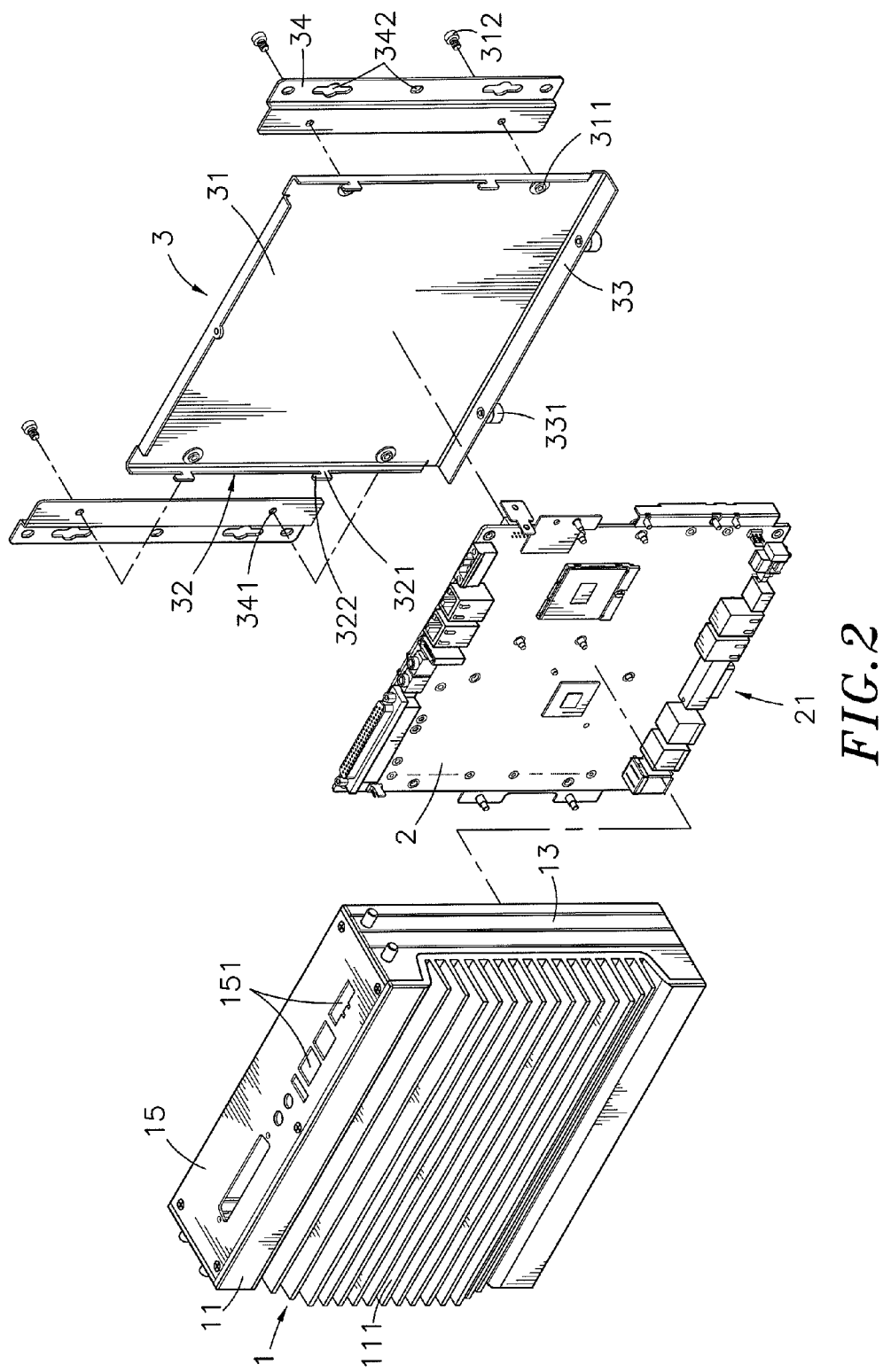
FIG. 2 is an exploded view of the wall mounting structure for wall-mounted electronic device in accordance with the present invention.
Figure 3:
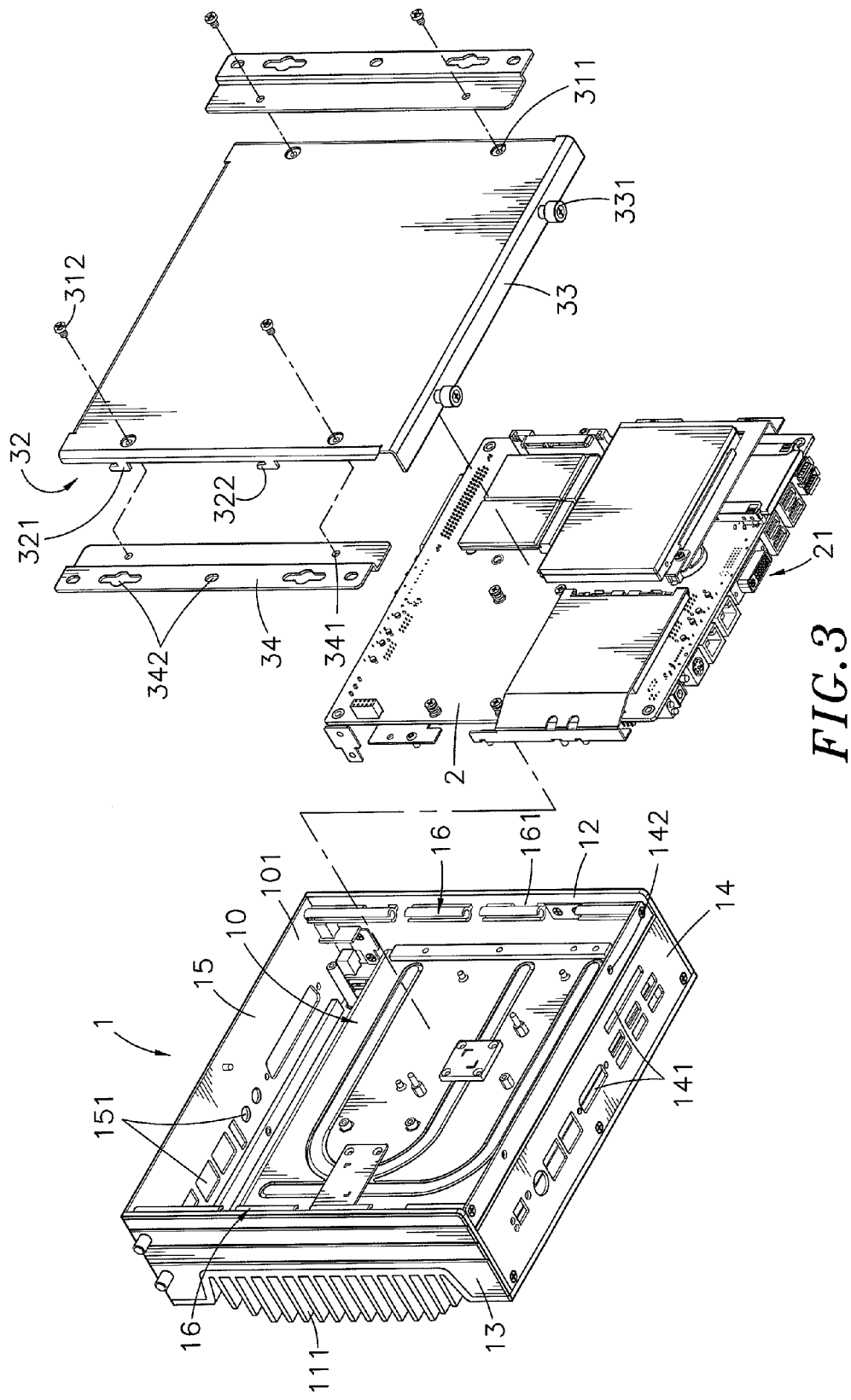
FIG. 3 corresponds to FIG. 2 when viewed from another angle.
Figure 4:
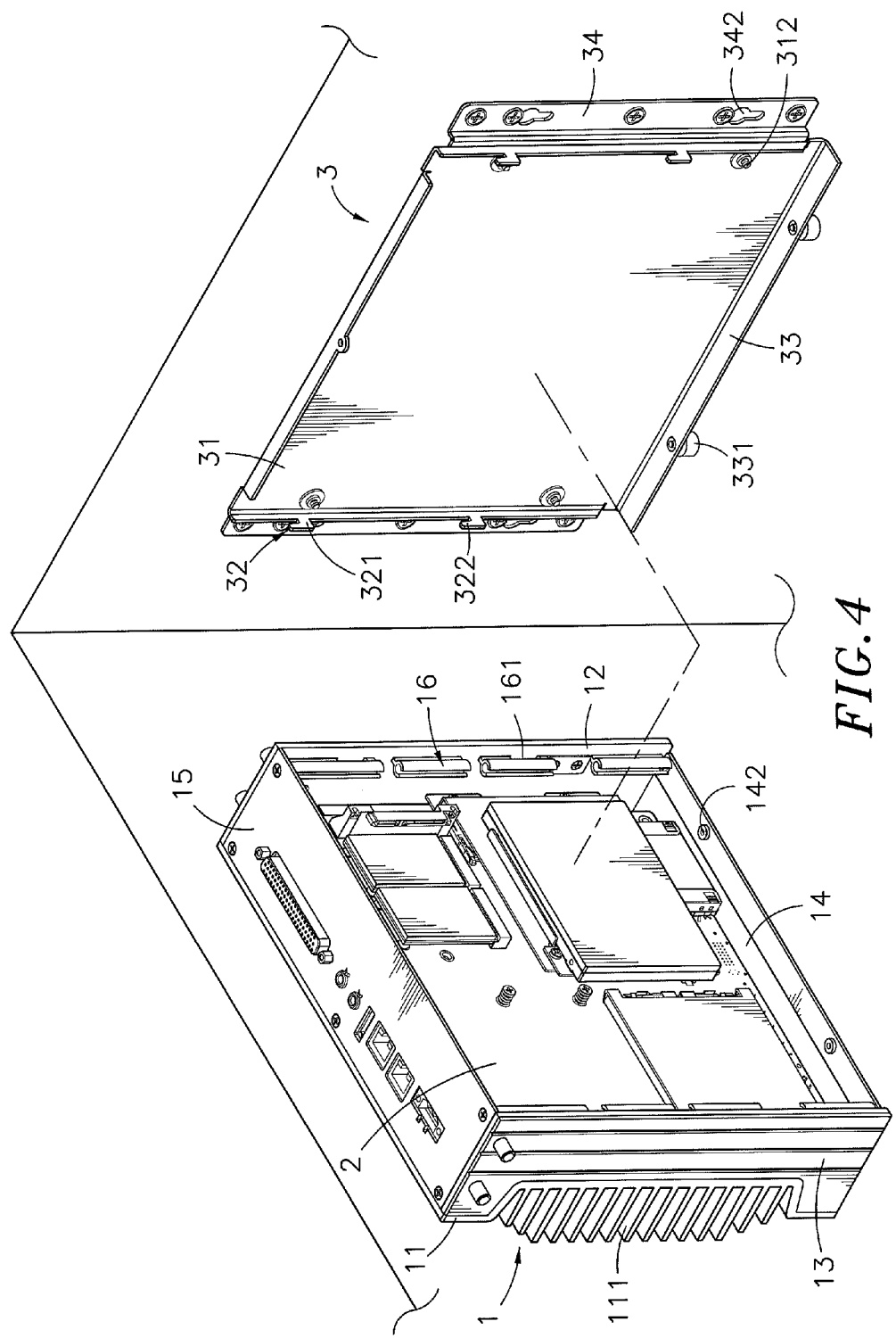
FIG. 4 is a schematic drawing of the present invention, illustrating the circuit board mounted in the device shell before installation of the back cover.
Figure 5:
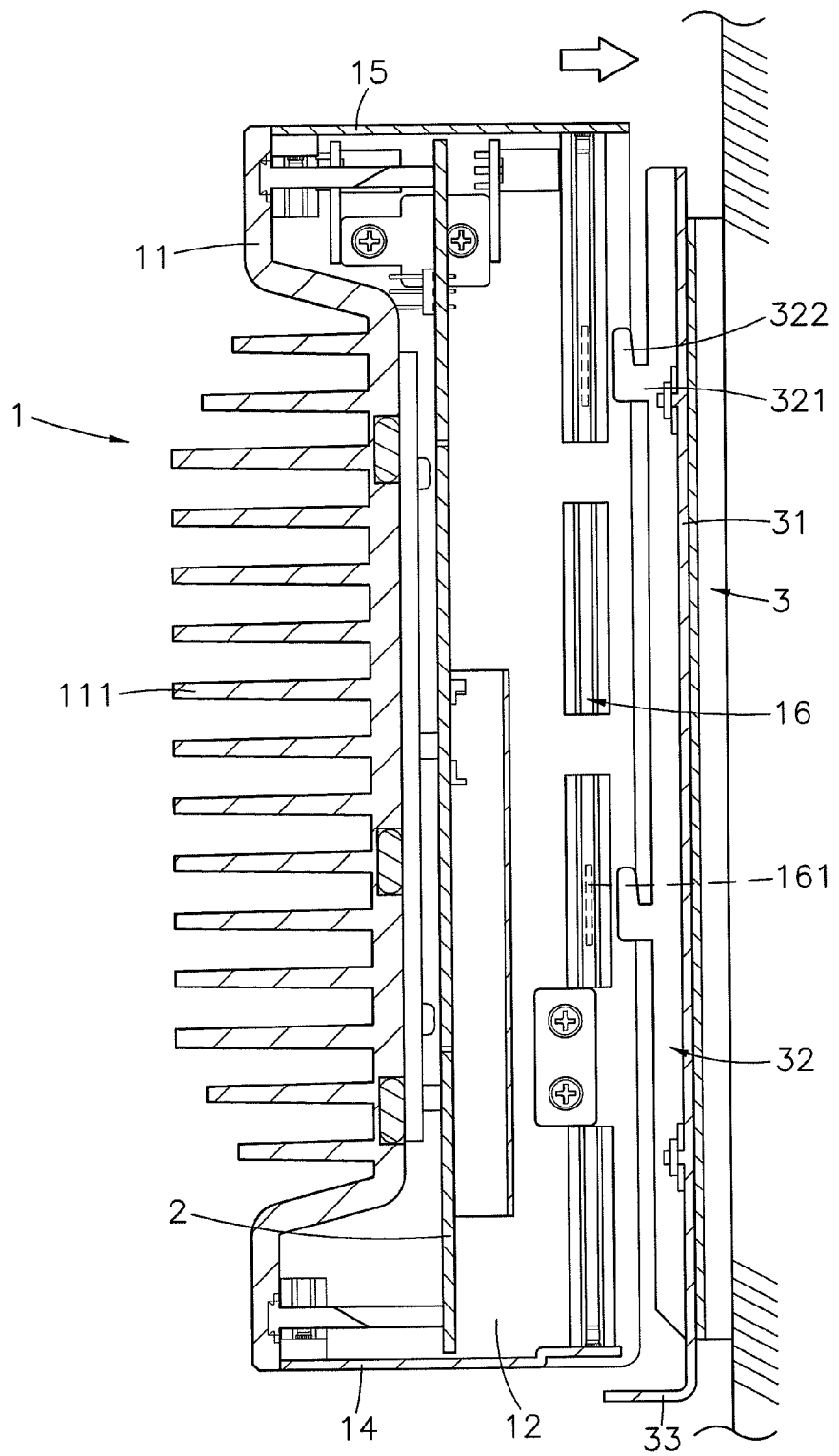
FIG. 5 is a side sectional view of the present invention, illustrating the sliding coupling rods with the respective hook tips of the back cover respectively inserted into the elongated sliding slots of the coupling structure of the device shell during installation of the wall mounting structure.
Figure 6:
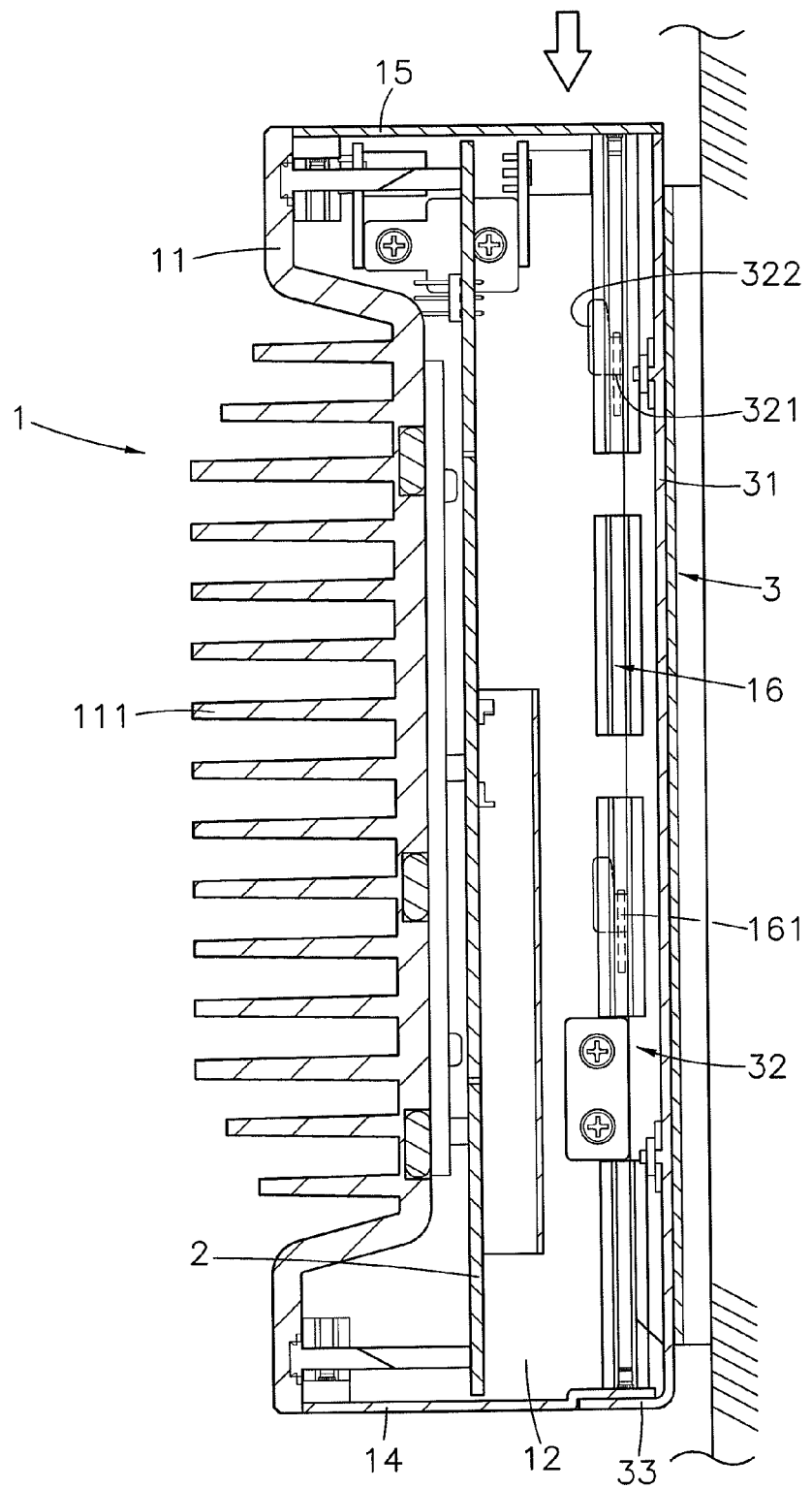
FIG. 6 corresponds to FIG. 4, a side sectional view illustrating the hook tips of the back cover hooked in the coupling structure of the device shell.
Figure 7:
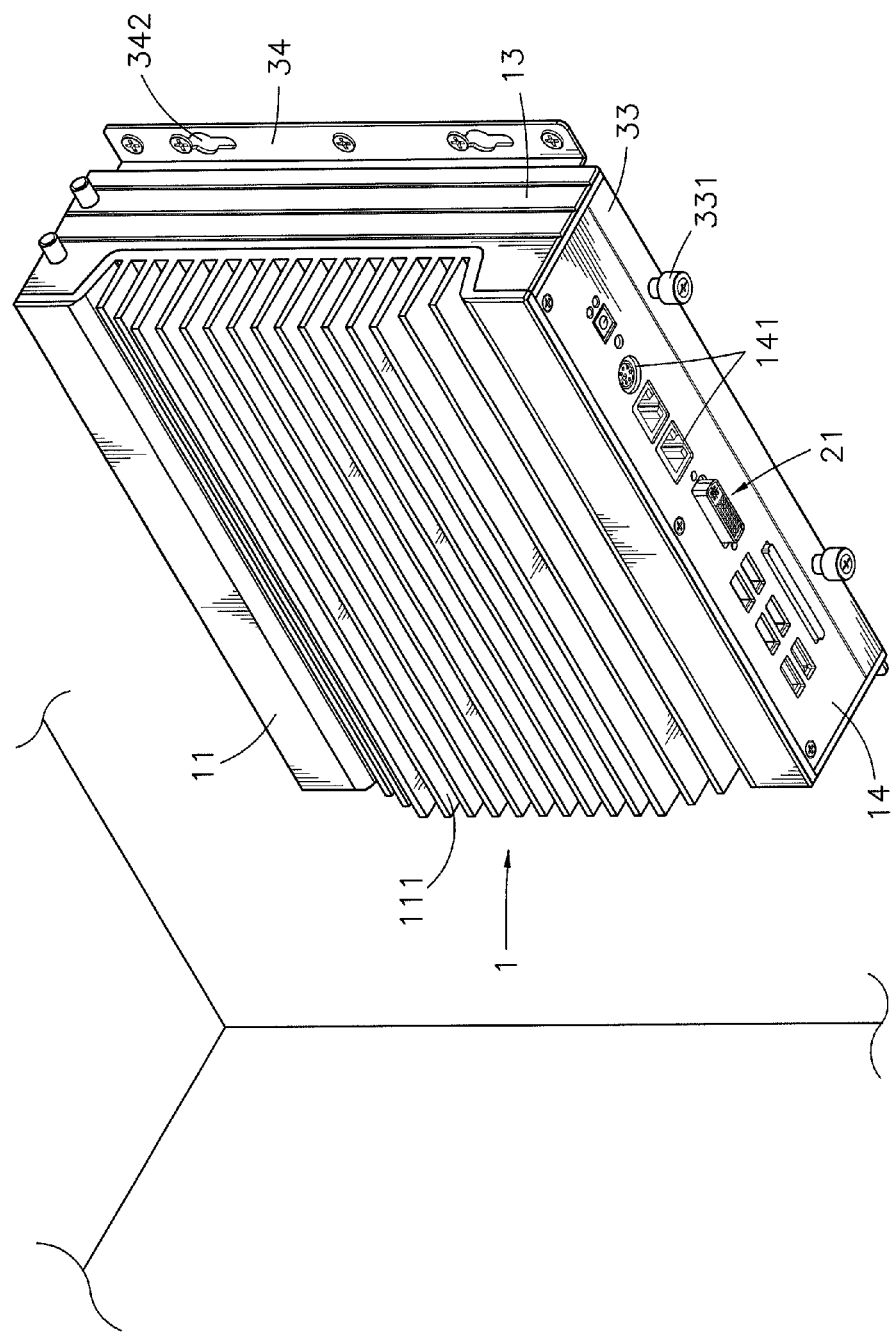
FIG. 7 is an oblique bottom elevational view of the present invention, illustrating the wall mounting structure assembled.

Referring to FIGS. 1, 2 and 3, a wall mounting structure for wall-mounted electronic device in accordance with the present invention is shown. The wall-mounting structure comprises a device shell 1, a circuit board 2, and a back cover 3.

The device shell 1 comprises a front panel 11, two opposing side panels 12 and 13 respectively perpendicularly extended from two opposing lateral sides of the front panel 11 in a parallel manner, opposing top panel 15 and bottom panel 14 respectively perpendicularly extended from opposing top and bottom sides of the front panel 11 in a parallel manner and respectively connected to opposing top and bottom sides of the side panels 12 and 13, an accommodation open chamber 10 surrounded by the front panel 11, the side panels 12 and 13, the top panel 15 and the bottom panel 14 and defining a back opening 101 opposite to the front panel 11, and a coupling structure 16 located on the side panels 12 and 13 at an inner side inside the accommodation open chamber 10. The coupling structure 16 comprises a plurality of elongated sliding slots 161 symmetrically and bilaterally disposed at different elevations.

Further, the front panel 11, can be a heat sink made of extruded aluminum, having a plurality of outwardly protruding radiation fins 111. The side panels 12 and 13, the top panel 15 and the bottom panel 14 are detachably fastened to the front panel 11. The bottom panel 14 has a plurality of openings 141 and at least one mounting screw hole 142. The top panel 15 has a plurality of openings 151.

The circuit board 2 is accommodated in the accommodation open chamber 10 of the device shell 1 in vertical and fastened to the back side of the front panel 11, carrying a circuit layout and a plurality of electronic components (not shown). The circuit board 2 further comprises a plurality of communication ports 21 respectively disposed corresponding to the openings 141 of the bottom panel 14 and/or the openings 151 of the top panel 15. Each of the communication ports 21 can be a USB connector, RJ45 connector, audio connector, video connector or power connector. Further, the circuit board 2 is kept spaced from the back side of the front panel 11 at a predetermined distance.

The back cover 3 is fastened to the back side of the device shell 1 opposite to the front panel 11 to close the back opening 101, comprising a cover plate 31, which comprises two side flanges 32 respectively perpendicularly extended from two opposite lateral sides thereof, a plurality of sliding coupling rods 321 respectively extended from the side flanges 32 and respectively terminating in a respective hook tip 322, a plurality of mounting through holes 311 symmetrically disposed adjacent to the side flanges 32 and disposed at different elevations, and a bottom flange 33 perpendicularly extended from the bottom side thereof, a plurality of fastening members 331, for example, floating screws arranged at the bottom flange 33 of the cover plate 31 corresponding to the mounting screw holes 142, and two mounting brackets 34. Each mounting bracket 34 comprises a plurality of screw holes 341 respectively fastened to the mounting through holes 311 adjacent to one of the side flanges 32 of the cover plate 31 by respective screws 312, and a plurality of mounting holes 342. According to this embodiment, the mounting brackets 34 are fastened to the cover plate 31 with screws 312. Alternatively, the mounting brackets 34 can be affixed to the cover plate 31 by rivets, laser welding, or any other techniques.

Referring to FIGS. 4-7 and FIGS. 1-3 again, the wall mounting structure can be fastened to a concrete, wood, synthetic or metal wall of a building, support or construction by means of the two mounting brackets 34 at the two opposite lateral sides of the cover plate 31. By means of the mounting holes 342, the mounting brackets 34 can be hung on wall hooks at a wall, or fastened to a wall with screws, expansion anchors or other fastening members.

During mounting, attach the device shell 1 to the cover plate 31 of the back cover 3 to couple the elongated sliding slots 161 of the coupling structure 16 to the sliding coupling rods 321 of at the side flanges 32 of the cover plate 31. As the width of the elongated sliding slots 161 is greater than the width of the sliding coupling rods 321, the sliding coupling rods 321 with the respective hook tips 322 can be respectively inserted into the elongated sliding slots 161 of the coupling structure 16. After insertion of the sliding coupling rods 321 with the respective hook tips 322 into the elongated sliding slots 161 of the coupling structure 16, the device shell 1 is lowered relative to the cover plate 31. At this time, the hook tips 322 of the sliding coupling rods 321 are respectively hooked in the coupling structure 16 to secure the device shell 1 to the back cover 3, and the bottom flange 33 of the cover plate 31 is stopped at the bottom side of the bottom panel 14 of the device shell 1. Thus, the back cover 3 closes the back opening 101 of the device shell 1. Thereafter, fasten a respective fastening member, for example, floating screw 331 of the back cover 3 to each respective mounting screw hole 142 of the bottom panel 14 to lock the back cover 3 to the device shell 1.

When going to detach the device shell 1 from the cover plate 31 of the back cover 3 for a maintenance or cleaning work, loosen the fastening members (floating screws) 331 of the back cover 3 from the mounting screw holes 142 of the bottom panel 14 of the device shell 1, and then lift the device shell 1 relative to the back cover 3 to disengage the hook tips 322 of the sliding coupling rods 321 from the coupling structure 16 for allowing removal of the sliding coupling rods 321 from the elongated sliding slots 161 of the coupling structure 16, and then move the device shell 1 forwardly away from the back cover 3. Thus, the invention facilitates mounting and dismounting between the device shell 1 and the back cover 3. After removal of the device shell 1 from the back cover 3, the circuit board 2 is exposed to the back opening 101, allowing dismounting directly for replacement or troubleshooting.

Further, multiple heat sources (CPU, active chip, interface card and etc.) of the circuit board 2 are kept in direct contact with the front panel 11 of the device shell 1. During operation of the circuit board 2 in the device shell 1, the device shell 1 absorbs waste heat from the heat sources of the circuit board 2 and dissipates absorbed waste heat into the outside open air through the radiation fins 111. Subject to the aforesaid arrangement of the wall mounting structure, dismounting between the device shell 1 and the back cover 3 can be performed easily without any tools, saving much labor and time. Further, a spare device shell can be used to replace the device shell 1 when necessary.

Figure 8:
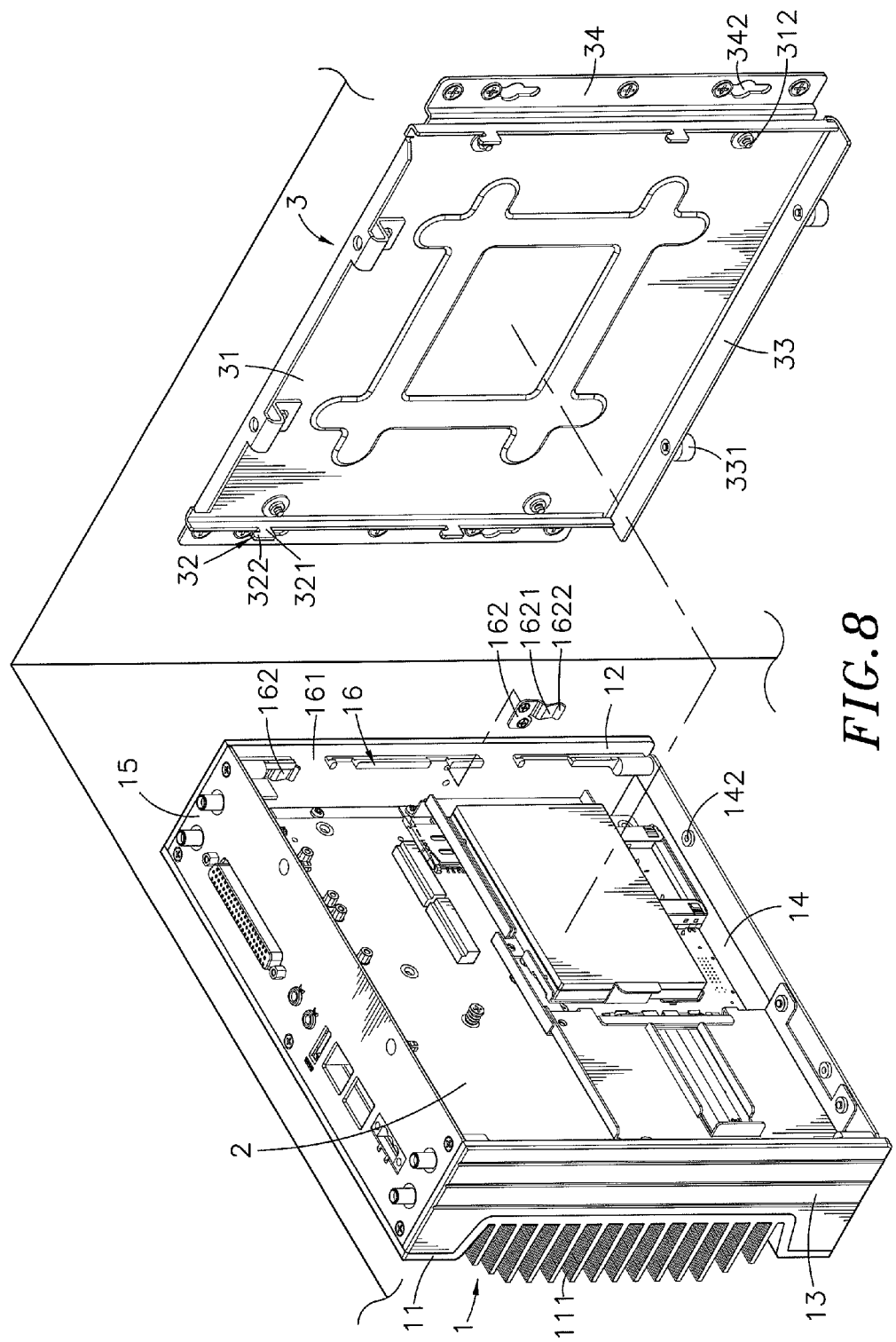
FIG. 8 is an exploded view of an alternate form of the wall mounting structure for wall-mounted electronic device in accordance with the present invention.
Figure 9:
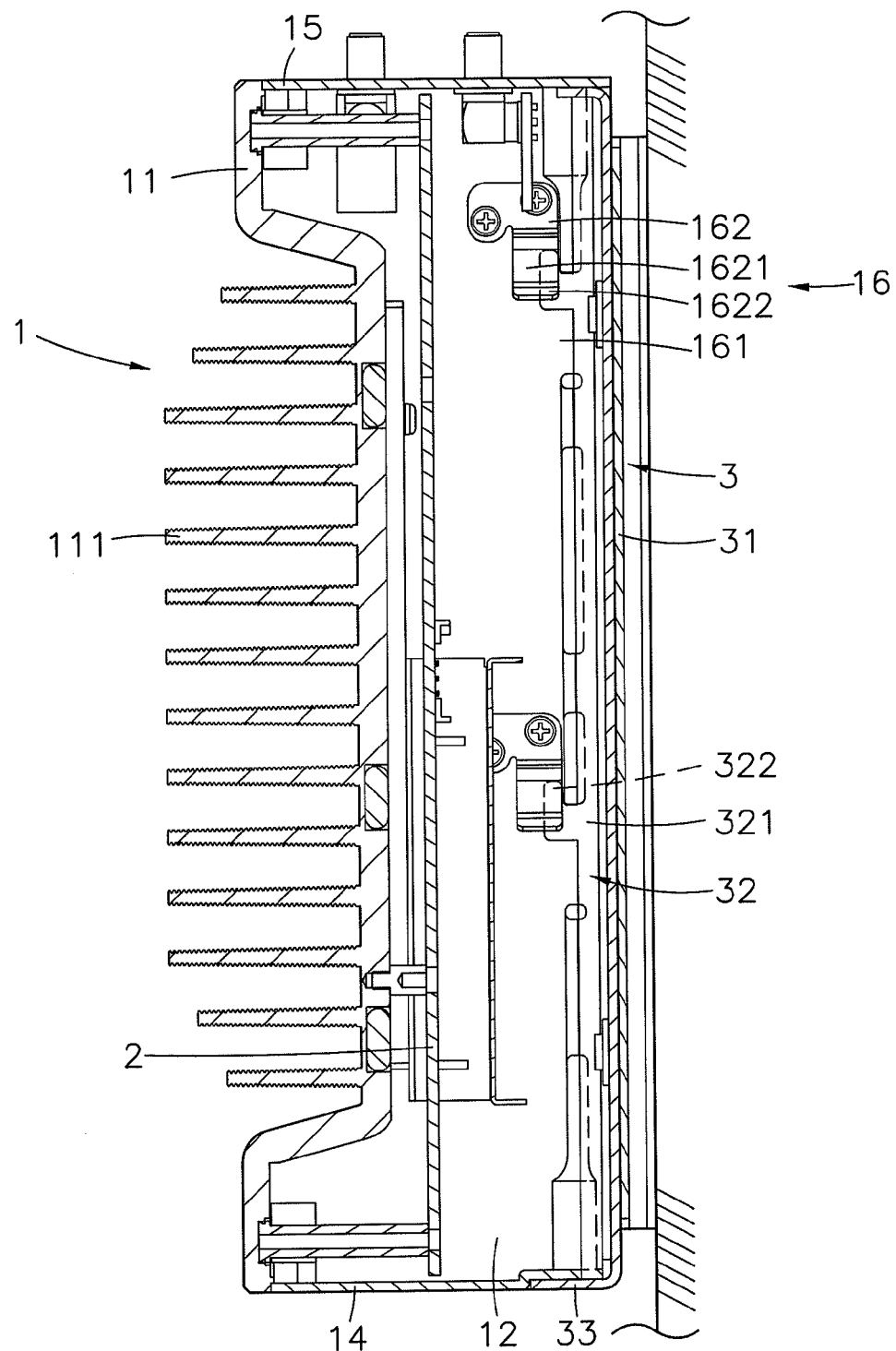
FIG. 9 is a schematic sectional side view of the alternate form of the present invention.
Figure 10:
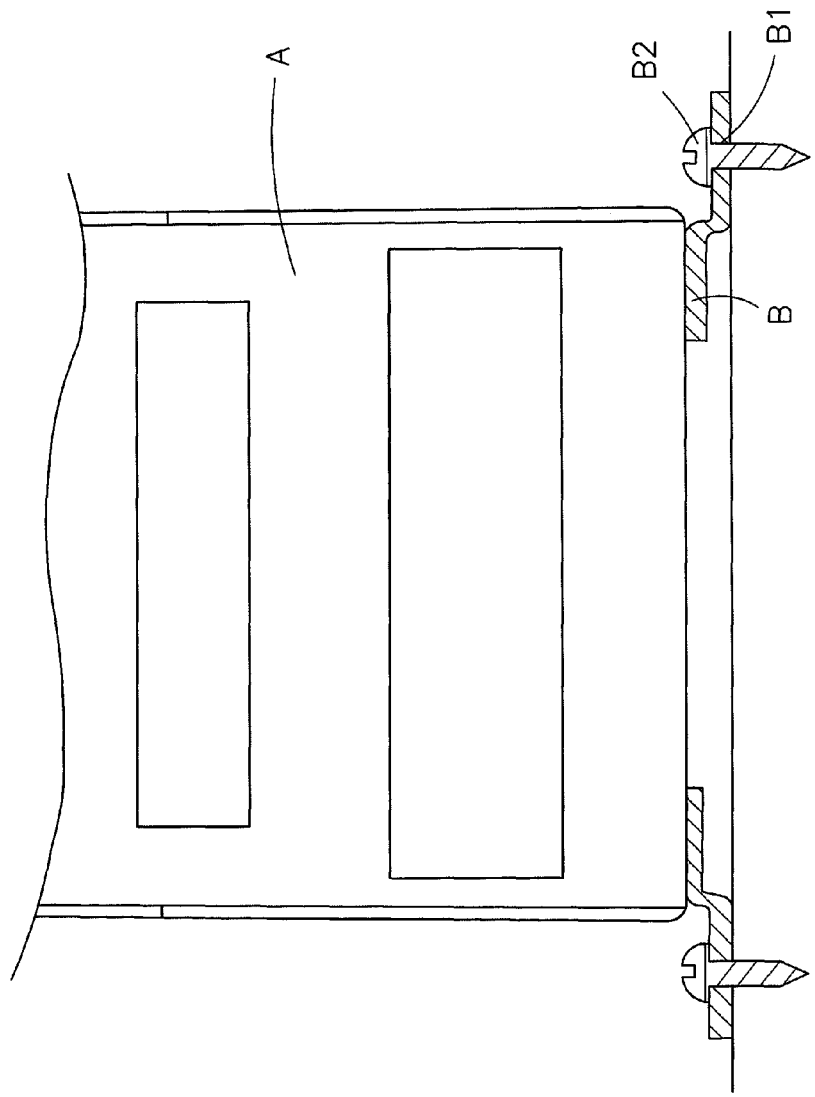
FIG. 10 is a schematic top sectional view of a wall-mounted computer according to the prior art.

FIGS. 8 and 9 illustrate an alternate form of the wall mounting structure for wall-mounted electronic device in accordance with the present invention. According to this alternate form, the coupling structure 16 of the device shell 1 comprises a plurality of elongated sliding slots 161 symmetrically disposed at the two opposing side panels 12 and 13 at different elevations, and a positioning member 162 located on each of the two opposing side panels 12 and 13 above the associating elongated sliding slots 161. Each positioning member 162 comprises an oblique spring arm 1621 gradually narrowing toward a bottom end thereof, and a retaining end portion 1622 curved from the bottom end of the oblique spring arm 1621.

When attach the device shell 1 to the cover plate 31 of the back cover 3 to couple the elongated sliding slots 161 of the coupling structure 16 to the sliding coupling rods 321 at the side flanges 32 of the cover plate 31, the sliding coupling rods 321 with the respective hook tips 322 are respectively inserted into the elongated sliding slots 161 of the coupling structure 16. After insertion of the sliding coupling rods 321 with the respective hook tips 322 into the elongated sliding slots 161 of the coupling structure 16, the device shell 1 is lowered relative to the cover plate 31. At this time, the hook tips 322 of the sliding coupling rods 321 are respectively hooked in the coupling structure 16 to secure the device shell 1 to the back cover 3, the retaining end portions 1622 of the positioning members 162 at the two opposing side panels 12 and 13 are respectively stopped against the hook tips 322 of the sliding coupling rods 321 of the back cover 3, and the bottom flange 33 of the cover plate 31 is stopped at the bottom side of the bottom panel 14 of the device shell 1. Thus, the back cover 3 closes the back opening 101 of the device shell 1. The positioning members 162 prevent the transverse displacement of the device shell 1 when there is any gap between the device shell 1 and the back cover 3. Further, the device shell 1 comprises at least one mounting screw hole 142 located on the bottom panel 14 thereof; the back cover 3 comprises at least one fastening member, for example, floating screw 331 disposed at the bottom flange 33 thereof for fastening to the at least one mounting screw hole 142 of the bottom panel 14 to lock the back cover 3 to the device shell 1. Alternatively, the back cover 3 can be configured to provide at least one mounting screw hole at the bottom flange 33 thereof, and the device shell 1 can be configured to provide at least one fastening member at the bottom flange 14 thereof for fastening to the at least one mounting screw hole at the bottom flange 33 of the back cover 3.

In conclusion, the invention provides a wall mounting structure for wall-mounted electronic device, which comprises a device shell 1 having a coupling structure 16 disposed in an accommodation open chamber 10 therein at two opposite lateral sides, a circuit board 2 mounted in the accommodation open chamber 10, and a back cover 3 for closing the back opening 101 of the accommodation open chamber 10. The back cover 3 comprises a cover plate 31 having sliding coupling rods 321 respectively extended from two side flanges 32 thereof and detachably coupled to the coupling structure 16 of the device shell 1 and a bottom flange 33 attached to the bottom side of the device shell 1 to support the device shell 1, and two mounting brackets 34 affixed to the cover plate 31 at two opposite lateral sides for fastening to a wall of an external object. Thus, the back cover 3 can be conveniently and detachably fastened to the device shell 1 without any tools, facilitating installation and repair work.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A wall mounting structure for wall-mounted electronic device, comprising:
    a device shell comprising a back opening, an accommodation open chamber disposed in communication with said back opening, and a coupling structure disposed in said accommodation open chamber at two opposite lateral sides;
    a circuit board mounted in said accommodation open chamber; and
    a back cover detachably fastenable to said device shell to close said back opening, said back cover comprising a cover plate, said cover plate comprising two side flanges respectively extended from two opposite lateral sides thereof, a plurality of sliding coupling rods respectively extended from said side flanges for coupling to said coupling structure of said device shell and a bottom flange perpendicularly extended from a bottom side thereof and attachable to the bottom side of said device shell to support said device shell, and two mounting brackets respectively fastened to the two opposite lateral sides of said cover plate and mountable at a wall of an external object to support said back cover and said device shell on said external object.

2. The wall mounting structure as claimed in claim 1, wherein said device shell comprises a front panel, two opposing side panels respectively perpendicularly extended from two opposing lateral sides of said front panel in a parallel manner, and opposing top panel and bottom panel respectively perpendicularly extended from opposing top and bottom sides of said front panel in a parallel manner and respectively connected to opposing top and bottom sides of said side panels; said accommodation open chamber is surrounded by said front panel, said side panels, said top panel and said bottom panel.

3. The wall mounting structure as claimed in claim 2, wherein said top panel and said bottom panel each comprise a plurality of openings; said circuit board comprises a plurality of communication ports respectively set in the openings at said top panel and said bottom panel of said device shell.

4. The wall mounting structure as claimed in claim 2, wherein said coupling structure of said device shell comprises a plurality of elongated sliding slots symmetrically disposed at said side panels at different elevations for receiving said sliding coupling rods of said cover plate of said back cover.

5. The wall mounting structure as claimed in claim 1, wherein said device shell further comprises at least one mounting screw hole disposed at a bottom side thereof; said back cover further comprises at least one fastening member arranged at said bottom flange of said cover plate and fastenable to said at least one mounting screw hole to lock said device shell to said cover plate of said back cover.

6. The wall mounting structure as claimed in claim 1, wherein said coupling structure of said device shell comprises a plurality of elongated sliding slots symmetrically disposed at said side panels at different elevations; said sliding coupling rods of said cover plate of said back cover are insertable into said elongated sliding slots of said coupling structure and respectively terminate in a respective hook tip for hooking in a top end of one respective elongated sliding slot of said coupling structure.

7. The wall mounting structure as claimed in claim 6, wherein said elongated sliding slots of said coupling structure has a width configured for the insertion of said hook tips and said sliding coupling rods of said cover plate of said back cover.

8. The wall mounting structure as claimed in claim 6, wherein said coupling structure of said device shell further comprises a plurality of positioning members symmetrically disposed at said side panels above said elongated sliding slots for stopping against said hook tips of said sliding coupling rods, each said positioning member comprising an oblique spring arm gradually narrowing toward a bottom end thereof and a retaining end portion curved from the bottom end of said oblique spring arm for stopping against the hook tip of one said sliding coupling rod.

9. The wall mounting structure as claimed in claim 1, wherein said cover plate of said back cover comprises a plurality of mounting through holes respectively disposed at different elevations adjacent to said side flanges; said brackets each comprise a plurality of screw holes respectively fastened to the mounting through holes of said cover plate by respective screws.

10. The wall mounting structure as claimed in claim 1, wherein said brackets each comprise a plurality of mounting holes for hanging on wall hooks at the wall of said external object or fastening to the wall of said external object by screw or expansion anchors.

* * * * *